United States Patent [19]

Sato

[11] Patent Number: 5,266,830
[45] Date of Patent: Nov. 30, 1993

[54] HETERO JUNCTION BIPOLAR TRANSISTOR WITH REDUCED SURFACE RECOMBINATION CURRENT

[75] Inventor: Hiroya Sato, Tenri, Japan

[73] Assignee: Sharp Kabushiki Kaisha, Osaka, Japan

[21] Appl. No.: 739,983

[22] Filed: Aug. 2, 1991

[30] Foreign Application Priority Data

Aug. 3, 1990 [JP] Japan .................. 2-207002

[51] Int. Cl.$^5$ .................. H01L 29/72; H01L 29/73
[52] U.S. Cl. .................. 257/571; 257/197; 257/586
[58] Field of Search .................. 357/16, 34, 52; 257/571, 586, 197

[56] References Cited

U.S. PATENT DOCUMENTS

| | | | |
|---|---|---|---|
| 3,677,837 | 7/1972 | Ashar* | 257/571 |
| 4,942,142 | 7/1990 | Itozaki et al. | 505/1 |
| 4,982,250 | 1/1991 | Manos et al. | 357/23.5 |

OTHER PUBLICATIONS

Nottenburg et al., *Applied Physic Letters* (1988) 52(3); 218-220.
Shikata et al., "Suppression of the emitter size effect on the current gain of AlGaAs/GaAs HBT by utilizing $(NH_4)_2 SX$ treatment".

*Primary Examiner*—Andrew J. James
*Assistant Examiner*—Valencia M. Martin
*Attorney, Agent, or Firm*—Morrison & Foerster

[57] ABSTRACT

According to the present invention, the hetero junction bipolar transistor (HBT) is provided which includes an emitter layer consisting of a first semiconductor of a first conductive type and being in mesa form; a base layer being in contact with the emitter layer and consisting of a second semiconductor of a second conductive type having a narrower band gap than the first semiconductor; and a collector layer being in contact with the base layer and consisting of a third semiconductor of a first conductive type having a broader band gap than the second semiconductor. In this HBT, a monolayer sulfur film is formed so as to cover the exposed periphery of the heterointerface between the emitter layer and the base layer.

5 Claims, 1 Drawing Sheet

HETERO JUNCTION BIPOLAR TRANSISTOR WITH REDUCED SURFACE RECOMBINATION CURRENT

BACKGROUND OF THE INVENTION

1. Field of the Invention:

The present invention relates to a hetero junction bipolar transistor (HBT), and more particularly, it relates to a highly efficient HBT in which a fine emitter is provided.

2. Description of the Prior Art:

With the development of an HBT in recent years, there has arisen a demand for decreasing the emitter size in order to realize high density in a so-called "emitter-up type" HBT. In the production of an HBT, a part of an emitter layer is removed by mesa etching, thereby exposing the corresponding part of a base layer. As a result of this mesa etching, the periphery of the emitter-base heterointerface is exposed outside. However with a decrease in the HBT size, the surface recombination current at the exposed periphery of the emitter-base heterointerface has become too large to be ignored. This has led to a decrease in the current amplification factor of the HBT.

Therefore, in order to prevent the decrease in the current amplification factor, the emitter-base heterointerface requires passivation. As a process for passivating the emitter-base heterointerface, there has been proposed the deposition of $Na_2S \cdot 9H_2O$ on the HBT surface (see Applied Physics Letters, 52(3)218, 1988).

In the above-mentioned conventional passivating process, this exposed periphery of the emitter-base heterointerface is covered with $Na_2S \cdot 9H_2O$ which is deposited on the entire surface of the HBT.

However, the HBT in which the exposed periphery of the emitter-base heterointerface has been passivated by $Na_2S \cdot 9H_2O$ mentioned above has a number of drawbacks as follows: (1) the current amplification property of the HBT is susceptible to the moisture present in the atmosphere due to the high water absorbing power of $Na_2S \cdot 9H_2O$; (2) the thin $Na_2S \cdot 9H_2O$ film has ionic conductivity, resulting in excess current; and (3) the current amplification factor can be maintained only for a short time in air due to the high absorbing power of $Na_2S \cdot 9H_2O$. These cause serious problems in the practical use thereof.

SUMMARY OF THE INVENTION

The hetero junction bipolar transistor of this invention, which overcomes the above-discussed and numerous other disadvantages and deficiencies of the prior art, comprises:

an emitter layer consisting of a first semiconductor of a first conductive type and being in mesa form;

a base layer being in contact with the emitter layer and consisting of a second semiconductor of a second conductive type, the second semiconductor having a narrower band gap than the first semiconductor;

a collector layer being in contact with the base layer and consisting of a third semiconductor of a first conductive type, the third semiconductor having a broader band gap than the second semiconductor; and a monolayer sulfur film which covers the exposed periphery of the heterointerface between the emitter layer and the base layer.

In a preferred embodiment, the monolayer sulfur film is formed by an $(NH_4)_2S_x$ solution or an $NH_4OH$ solution containing $P_2S_5$.

In a preferred embodiment, a water resistant protective coat is formed on the monolayer sulfur film.

Thus, the invention described herein makes possible the objective of providing an HBT having high current amplification factor even in a fine structure by reducing the surface recombination current at the exposed periphery of the heterointerface between the emitter layer and the base layer.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

The monolayer sulfur film herein used is a film consisting of only one layer of S molecules or S atoms with the film consisting of only one layer of S atoms preferred.

The monolayer sulfur film is formed so as to cover a depletion layer at the exposed periphery of the heterointerface between the emitter layer and the base layer. Preferably, the film should cover the depletion layer area having a width more than that of the depletion layer when the base-emitter bias is 0 (V).

A multilayer sulfur film in which a multilayer is formed by S molecules or atoms is unstable, and susceptible to a change with time due to the release of sulfur atoms. As compared with the multilayer sulfur film, the monolayer sulfur film is more stable, shows a slight change with time, and will not deteriorate the insulating property.

The passivation of the exposed periphery of the heterointerface between the emitter layer and the base layer can be insured by forming a monolayer sulfur film thereon, thereby reducing the surface recombination current at the exposed periphery of the heterointerface between the emitter layer and the base layer. Therefore, the high current amplification factor can be maintained even in a fine structured HBT.

EXAMPLES

The following illustrates the examples of the present invention by reference to drawings, but the present invention is not limited to the examples.

EXAMPLE 1

Figure 1A:
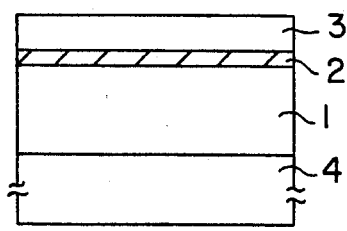
FIGS. 1(a) to 1(c) are flow diagrams showing the main processes for manufacturing an npnAlGaAs/GaAs HBT of the present invention.

First, on the surface of an $n^+$-GaAs substrate 4, an Si-doped $n^+$-GaAs collector layer 1 with a dose of $5 \times 10^{15}$ cm$^{-3}$, a Be-doped p-GaAs base layer 2 with a dose of $5 \times 10^{18}$ cm$^{-3}$, and an Si-doped n-AlGaAs emitter layer 3 with a dose of $2 \times 10^{17}$ cm$^{-3}$ were successively grown by means of a molecular beam epitaxy (MBE) apparatus (FIG. 1(a)). Then, the emitter layer 3 was formed in the shape of a mesa by mesa etching using an etchant such as a phosphoric acid solution. On this mesa emitter layer 3a and the other surface of the substrate 4 were formed n-sided contact electrodes 5a and 5b consisting of AuGe/Ni/Au. On the portions of the base layer 2 exposed as a result of the formation of the mesa emitter layer 3a mentioned above were formed p-sided contact electrodes 6 consisting of AuZn/Au by vacuum evaporation. Thereafter, the substrate thus obtained was subjected to alloying in a hydrogen atmosphere at 420° C. for 2 seconds to bring the n-sided contact electrodes 5a and 5b and the p-sided contact electrodes 6 each into close contact with the corresponding lower layer. Then, the collector layer 1 and the base layer 2 were formed into the shape of a mesa by mesa etching using the etchant such as a phosphoric acid solution mentioned above, thereby obtaining an HBT (FIG. 1(b)).

The HBT thus obtained was immersed in a mixture of $NH_4OH$ and $H_2O$ at a volume ratio of 1:2 for 5 seconds, and then in a mixture of $HNO_3$ and $H_2O$ at a volume ratio of 1:19 for 2 seconds, thereby removing the natural oxide film formed on the semiconductor surface. Immediately after this process, this HBT was immersed in an $(NH_4)_2S_x$ solution containing about 8% excess S. Then, pure water was gradually added to dilute the $(NH_4)_2S_x$ solution, after which this HBT was removed from the solution. Thus, a monolayer sulfur film (too thin to appear in the drawings) was formed so as to cover the exposed periphery of the heterointerface between the mesa emitter layer 3a and the base layer 2 and the exposed portions of the mesa emitter layer 3a and the base layer 2. On the whole HBT surface where the mesa emitter layer 3a was provided, a polyimide film was formed by spin coating to act as a water resistant protective coat 7 (FIG. 1(c)). By etching using conventional photolithography and oxygen plasma, contact holes each facing the corresponding n-sided contact electrode 5a and p-sided contact electrodes 6 were formed in the water resistant protective coat 7. The HBT thus prepared is referred to as sample A.

As mentioned above, when the HBT is treated with an $(NH_4)_2S_x$ solution, a thin sulfur film (up to 10 nm) is formed on the HBT surface. This multilayer film can be readily removed by gradually reducing the concentration of the $(NH_4)_2S_x$ solution as mentioned above, or exposing it to vacuum at the end of the treatment of the semiconductor surface with the $(NH_4)_2S_x$ solution. That is, since an As-S bond and a Ga-S bond are stronger than an S-S bond, the sulfur laminates prepared by the aforesaid treatment is gradually removed to form a monoatomic layer sulfur film which is stable and shows the least change with time.

EXAMPLE 2

Figure 1B:
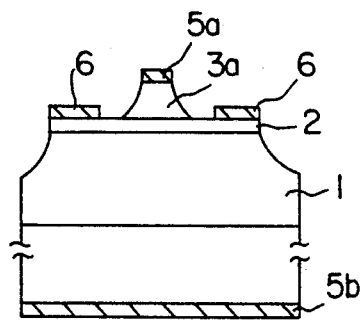
Figure 1C:
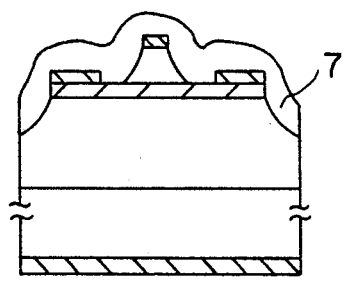

The HBT shown in FIG. 1(b) was immersed in the mixture of $NH_4OH$ and $H_2O$ at a volume ratio of 1:2 mentioned above for 5 seconds, and then in the mixture of $HNO_3$ and $H_2O$ at a volume ration of 1:19 for 2 seconds. Immediately after this process, this HBT was immersed in an $NH_4OH$ solution containing 0.1 g/mol of $P_2S_5$. Then, pure water was gradually added to dilute the $NH_4OH$ solution, after which this HBT was removed from the solution. Thus, a monolayer sulfur film (too thin to appear in the drawings) was formed so as to cover the exposed periphery of the heterointerface between the mesa emitter layer 3a and the base layer 2 and the exposed portions of the mesa emitter layer 3a and the base layer 2. A polyimide film was formed by spin coating to act as a water resistant protective coat 7 on the whole HBT surface where the mesa emitter layer 3a was provided. By etching using conventional photolithography and oxygen plasma, contact holes each facing the corresponding n-sided contact electrode 5a and p-sided contact electrodes 6 were formed in the water resistant protective coat 7. The HBT thus prepared is referred to as sample B.

When the $(NH_4)_2S_x$ solution and the $NH_4OH$ solution containing $P_2S_5$ come in contact with the compound semiconductor surface, the natural oxide film on the compound semiconductor surface acting as a surface recombination center is removed, and a monolayer sulfur film is formed thereon. This monolayer sulfur film is more stable to moisture compared with the $Na_2S.9H_2O$ film. As described above, the stability of the HBT can be greatly improved by forming a water resistant protective coat.

COMPARATIVE EXAMPLE 1

The HBT shown in FIG. 1(b) was immersed in the mixture of $NH_4OH$ and $H_2O$ at a volume ratio of 1:2 mentioned above for 5 seconds, and then in the mixture of $HNO_3$ and $H_2O$ at a volume ratio of 1:19 mentioned above for 2 seconds. Immediately after this process, an $Na_2S.9H_2O$ aqueous solution was applied by spin coating to the whole HBT surface where the mesa emitter layer 3a was formed, and this HBT was dried so as to form a protective coat. The HBT thus prepared is referred to as sample C.

COMPARATIVE EXAMPLE 2

The HBT shown in FIG. 1(b) was immersed in the mixture of $NH_4OH$ and $H_2O$ at a volume ratio of 1:2 mentioned above for 5 seconds, and then in the mixture of $HNO_3$ and $H_2O$ at a volume ratio of 1:19 mentioned above for 2 seconds. Immediately after this process, this HBT was washed with water, after which a polyimide film was formed by spin coating so as to act as a water resistant protective coat 7 on the whole HBT surface where the mesa emitter layer 3a was formed. By etching using conventional photolithography and oxygen plasma, contact holes each facing the corresponding n-sided contact electrode 5a and p-sided contact electrodes 6 were formed in the water resistant protective coat 7. The HBT thus prepared is referred to as sample D.

Figure 2:
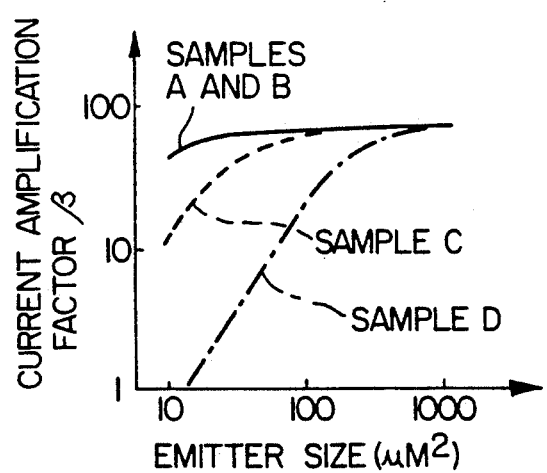
FIG. 2 is a graph showing the dependence of the current amplification factor on the emitter size of each HBT of the examples and the comparative examples of the present invention.

As mentioned above, the samples A, B, C, and D were prepared and kept in the atmosphere for 10 days, after which the dependence of the current amplification factor $\beta$ on the emitter size of each HBT sample was measured. The results are shown in FIG. 2. As shown in FIG. 2, with a decrease in the emitter size, the current amplification factor $\beta$ of the samples C and D showed a sharp decline, while the current amplification factor $\beta$ of the samples A and B showed a slight decrease. Thus, by forming the monolayer sulfur film so as to cover the exposed periphery of the heterointerface between the emitter layer and the base layer, the surface recombination current can be reduced, thereby maintaining a high current amplification factor even in a finer structured HBT.

In the above examples, the present invention was described by using an AlGaAs/GaAs type HBT, but it is not limited to this type of HBT. Needless to say that other lattice matching type such as InGaAs/InAlAs type, and InGaAs/InP type, or a lattice mismatching type such as InGaAs/AlGaAs type may also be used.

For the HBT structure, not only a single hetero bipolar transistor (SHBT) in which only the emitter has a wide band gap, but also a double hetero bipolar transistor (DHBT) in which the collector also has a wide band gap may be used.

The water resistant protective coat 7 is not limited to the polymide film, and may be formed by the use of SiN, $SiO_2$, etc.

Further, other than the surface treatment shown in the above examples, for example, the following processes may be used: the HBT of FIG. 1(b) is immersed in $Na_2S.9H_2O$, after which the HBT was washed with water to remove $Na_2S$, thereby leaving only sulfur layer; and in order to form more complete sulfur monoatomiclayer after washing the HBT with water and removing $Na_2S$, the process described in the above examples is further conducted.

According to the present invention, since the surface recombination current at the exposed periphery of the heterointerface between the emitter layer and the base layer can be reduced, the decrease in the HBT size can be achieved without reducing the current amplification property. This leads to the practical use of a high frequency, high integrated HBT.

It is understood that various other modification will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A hetero junction bipolar transistor, comprising:
   an emitter layer consisting of a first semiconductor layer of a first conductive type and being in mesa form;
   a base layer being in contact with said emitter layer and consisting of a second semiconductor layer of a second conductive type, said second semiconductor layer having a narrower band gap than said first semiconductor layer;
   a collector layer being in contact with said base layer and consisting of a third semiconductor layer of a first conductive type, said third semiconductor layer having a broader band gap than said second semiconductor layer; and
   a monolayer sulfur film being a single atom layer of sulfur atoms or a single molecular layer of sulfur molecules which covers the exposed periphery of the hetero interface between said emitter layer and said base layer.

2. A hetero junction bipolar transistor according to claim 1, wherein a water resistant protective coat is formed on said monolayer sulfur film.

3. A hetero junction bipolar transistor according to claim 1, wherein said monolayer sulfur film further covers a depletion region.

4. A hetero junction bipolar transistor according to claim 3, wherein said monolayer sulfur film has a width wider than that of said depletion region at a base-emitter bias of 0 (V).

5. A hetero junction bipolar transistor according to claim 1, wherein said monolayer sulfur film further covers exposed portions of the mesa emitter layer and the base layer. T

* * * * *